(12) United States Patent
Kim (10) Patent No.: US 9,773,548 B2
(45) Date of Patent: Sep. 26, 2017

(54) ELECTRONIC DEVICE AND METHOD FOR DRIVING THE SAME

(71) Applicant: SK hynix Inc., Icheon (KR)

(72) Inventor: Kyung-Wan Kim, Icheon (KR)

(73) Assignee: SK HYNIX INC., Icheon (KR)

(*) Notice: Subject to any disclaimer, the term of this patent is extended or adjusted under 35 U.S.C. 154(b) by 0 days.

(21) Appl. No.: 15/134,068

(22) Filed: Apr. 20, 2016

(65) Prior Publication Data

US 2017/0186485 A1    Jun. 29, 2017

(30) Foreign Application Priority Data

Dec. 23, 2015  (KR) .................. 10-2015-0184556

(51) Int. Cl.
  *G11C 11/00* (2006.01)
  *G11C 13/00* (2006.01)
  *G06F 12/0875* (2016.01)

(52) U.S. Cl.
  CPC ........ *G11C 13/004* (2013.01); *G06F 12/0875* (2013.01); *G11C 13/0023* (2013.01); *G11C 13/0028* (2013.01); *G11C 13/0038* (2013.01); *G11C 13/0069* (2013.01); *G06F 2212/452* (2013.01)

(58) Field of Classification Search
  CPC .............. G11C 13/004; G11C 13/0038; G11C 13/0028; G11C 13/0069; G11C 13/0023; G06F 12/0875
  USPC .......................................... 365/148, 196, 205
  See application file for complete search history.

(56) References Cited

U.S. PATENT DOCUMENTS

| | | | | |
|---|---|---|---|---|
| 6,795,359 B1* | 9/2004 | Baker | ...................... | G11C 7/06 365/158 |
| 7,272,034 B1* | 9/2007 | Chen | ...................... | G11C 11/16 365/158 |
| 2002/0101766 A1* | 8/2002 | Baltar | .................. | G11C 7/1048 365/189.09 |
| 2002/0196664 A1* | 12/2002 | Pasotti | .................. | G11C 7/062 365/185.21 |
| 2003/0161178 A1* | 8/2003 | Tran | ........................ | G11C 11/16 365/158 |
| 2004/0032760 A1* | 2/2004 | Baker | ...................... | G11C 7/06 365/148 |
| 2005/0078505 A1* | 4/2005 | Voshell | ..................... | G11C 7/06 365/148 |
| 2005/0105329 A1* | 5/2005 | Nazarian | ................. | B82Y 10/00 365/158 |
| 2005/0226034 A1* | 10/2005 | Pemer | ...................... | G11C 11/16 365/158 |
| 2006/0071646 A1* | 4/2006 | Paillet | ..................... | G11C 17/18 320/166 |

(Continued)

FOREIGN PATENT DOCUMENTS

KR   10-2002-0096746 A   12/2002

*Primary Examiner* — Viet Q Nguyen (57) ABSTRACT

An electronic device includes a semiconductor memory that includes: a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current.

20 Claims, 6 Drawing Sheets

(56) References Cited

U.S. PATENT DOCUMENTS

| | | | | |
|---|---|---|---|---|
| 2006/0221734 A1* | 10/2006 | Bedeschi | ............... | G11C 7/062 365/201 |
| 2006/0279980 A1* | 12/2006 | Haratani | ............... | H01L 27/224 365/158 |
| 2007/0019464 A1* | 1/2007 | Ezaki | ...................... | G11C 11/16 365/158 |
| 2007/0177442 A1* | 8/2007 | Tomishima | ............ | G11C 7/062 365/207 |
| 2008/0094876 A1* | 4/2008 | Siau | ........................ | G11C 11/16 365/148 |
| 2008/0310221 A1* | 12/2008 | Baker | .................... | G11C 5/147 365/185.2 |
| 2009/0034338 A1* | 2/2009 | Lin | ........................ | G11C 16/30 365/185.21 |
| 2011/0096587 A1* | 4/2011 | Kim | ..................... | G11C 7/1045 365/148 |
| 2013/0148406 A1* | 6/2013 | Shimakawa | ........ | G11C 11/1673 365/148 |
| 2014/0177353 A1* | 6/2014 | Park | .................. | G11C 13/0002 365/189.14 |
| 2015/0371695 A1* | 12/2015 | Roy | .................... | G11C 11/1673 365/158 |

\* cited by examiner

ELECTRONIC DEVICE AND METHOD FOR DRIVING THE SAME

CROSS-REFERENCE TO RELATED APPLICATIONS

The present application claims priority of Korean Patent Application No. 10-2015-0184556, entitled "ELECTRONIC DEVICE" and filed on Dec. 23, 2015, which is incorporated herein by reference in its entirety.

BACKGROUND

1. Field

This patent document relates to memory circuits or devices and their applications in electronic devices or system.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device that may have immunity to read disturbance and random telegraph noise (RTN).

In one aspect, an electronic device includes a semiconductor memory, wherein the semiconductor memory includes: a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current.

Implementations of the above electronic device may include one or more the following.

The alternate current may correspond to the cell current flowing through the memory cell, and the alternate current supply block may supply the alternate current when the resistance state of the memory cell is a low resistance state. The alternate current supply block may be configured to determine whether the alternate current is supplied or not based on a voltage loaded onto one of the first selection block and the second selection block. The alternate current supply block may include: a supply control unit configured to generate a supply control signal based on the voltage; and a supply path unit configured to supply the alternate current to the sensing block in response to the supply control signal. The supply control unit may include a voltage follower, and the supply path unit may include a switching element.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In one aspect, an electronic device includes a semiconductor memory, wherein the semiconductor memory includes: a plurality of row lines; a plurality of column lines crossing the plurality of row lines; a plurality of memory cells coupled between the row lines and the column lines; a plurality of row selection blocks configured to select one among the plurality of row lines based on a plurality of row selection signals; a plurality of column selection blocks configured to select one among the plurality of column lines based on a plurality of column selection signals; an alternate current supply block coupled to the plurality of row selection blocks at a common node and configured to supply, during a read operation, an alternate current based on a voltage loaded onto one among the plurality of row selection blocks; and a sensing block configured to sense, during the read operation, at least one of a cell current and the alternate current, the cell current flowing through a selected one of the plurality of memory cells.

Implementations of the above electronic device may include one or more the following.

The alternate current may correspond to the cell current flowing through the selected memory cell, and the alternate current supply block may supply the alternate current to the sensing block when the selected memory cell is in a low resistance state. Each of the plurality of row selection blocks may include one or more switching elements, each configured to supply a high voltage to a corresponding row line among the plurality of row lines based on a corresponding row selection signal among the plurality of row selection signals. Each of the plurality of row selection blocks may include first and second switching elements coupled to each other in series, and the alternate current supply block may be coupled to a coupling node between the first and second switching elements. The alternate current supply block may include: a supply control unit configured to generate a supply control signal based on a voltage loaded onto the coupling node; and a supply path unit configured to supply the alternate current to the sensing block in response to the supply control signal. The supply control unit may include a voltage follower, and the supply path unit may include a switching element. Each of the plurality of row selection blocks may include one or more switching elements, and the alternate current supply block may be coupled to a coupling node between a supply terminal supplying a high voltage and one of the switching elements. The alternate current supply block may include: a supply control unit configured to generate a supply control signal based on a voltage loaded onto the coupling node; and a supply path unit configured to supply the alternate current to the sensing block in response to the supply control signal. The supply control unit may include a voltage follower, and the supply path unit may include a switching element.

In one aspect, a method for driving an electronic device including a semiconductor memory, the method includes: selecting a memory cell coupled between a single row line among a plurality of row lines and a single column line among a plurality of column lines; and sensing one of a first read current and a second read current, the first read current being a resultant current based on a first cell current flowing through the memory cell when the memory cell is in a low resistance state and an alternate current generated based on the first cell current, the second read current being a second cell current flowing through the memory cell when the memory cell is in a high resistance state.

These and other aspects, implementations and associated advantages are described in greater detail in the drawings, the description and the claims.

DETAILED DESCRIPTION

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor memory device in accordance with implementations of the disclosed technology may include a variable resistance element that exhibits a variable resistance characteristic. Different resistance values of the variable resistance element represent different digital bits or states. In implementations, such a variable resistance element may include a single layer structure or a multi-layer structure that exhibits the variable resistance characteristic. The variable resistance element may include a material used in an RRAM, PRAM, STTRAM, MRAM, or FRAM device (e.g., a ferromagnetic material); a ferroelectric material; a phase change material such as a chalcogenide material; a metal oxide such as a perovskite material; and/or a transition metal oxide.

The metal oxide included in an implementation of the variable resistance element may be a transition metal oxide such as nickel oxide (NiO), titanium oxide (TiO), hafnium oxide (HfO), zirconium oxide (ZrO), tungsten oxide (WO), or cobalt oxide (CoO); a perovskite material such as strontium titanium oxide (STO: SrTiO); and/or praseodymium calcium manganese oxide (PCMO: PrCaMnO).

The phase change material included in an implementation of the variable resistance element may include a chalcogenide material such as a germanium-antimony-tellurium alloy (GST: Ge—Sb—Te). The variable resistance element may switch between different resistance states when applied heat changes the phase change material from a crystalline state to an amorphous state, or vice versa.

The variable resistance element may include two magnetic layers and a tunnel barrier layer interposed between the two magnetic layers. The magnetic layer may include one of a nickel-cobalt ferrous alloy (Ni—Fe—Co), a cobalt ferrous alloy (Co—Fe), etc. The tunnel barrier layer may include aluminum oxide ($Al_2O_3$). The variable resistance element may switch between two different resistance states according to a magnetization direction of each of the two magnetic layers. For example, the variable resistance element may be in a low resistance state when the magnetization directions of the two magnetic layers are parallel, and be in a high resistance state when the magnetization directions of the two magnetic layers are anti-parallel.

Figure 1:
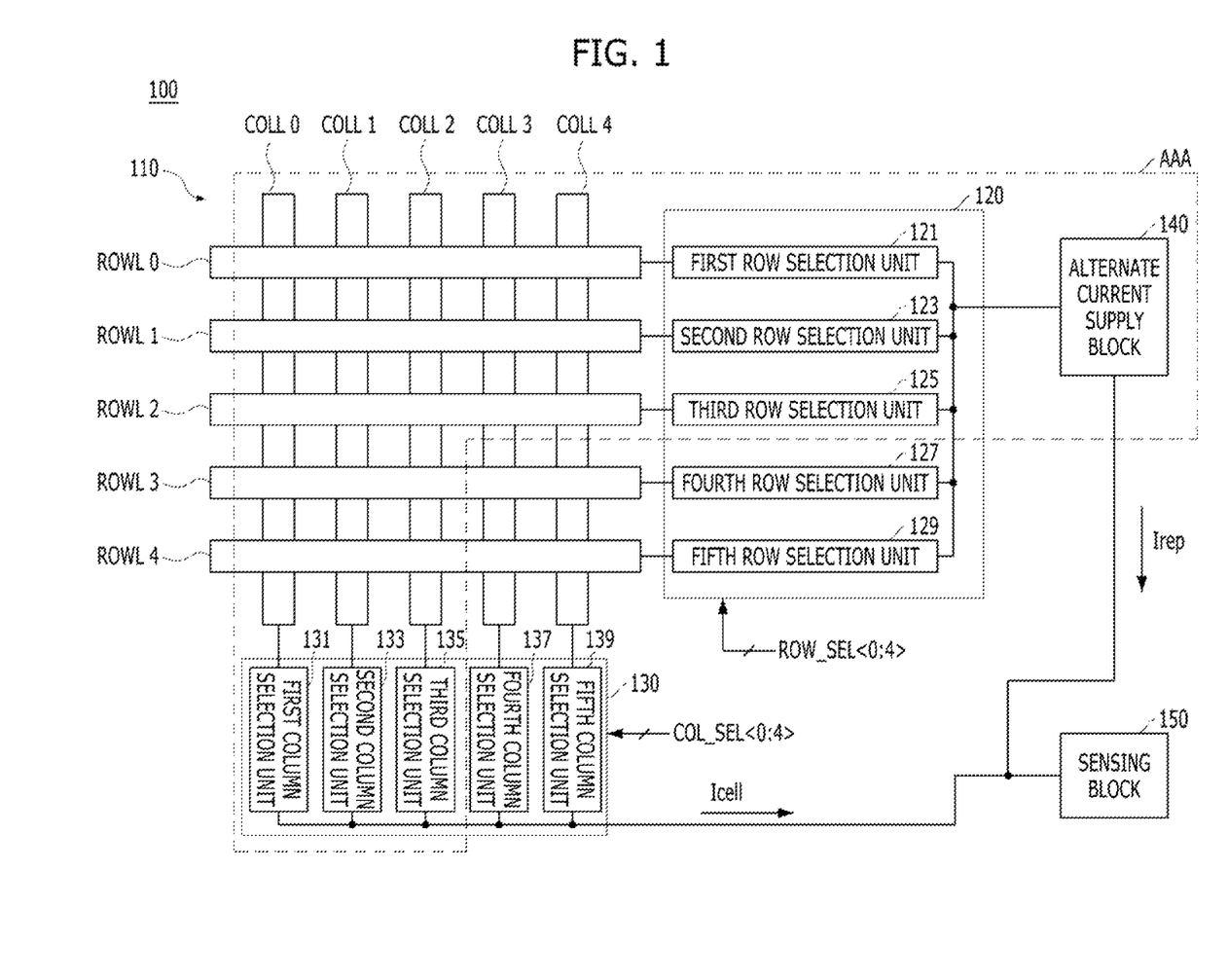
FIG. 1 is a block diagram illustrating a memory circuit in accordance with an implementation of the present disclosure.

FIG. 1 is a block diagram illustrating a memory circuit 100 in accordance with an implementation of the present disclosure.

Referring to FIG. 1, the memory circuit 100 may include a memory cell array 110, a row selection block 120, a column selection block 130, an alternate current supply block 140, and a sensing block 150.

Figure 2:
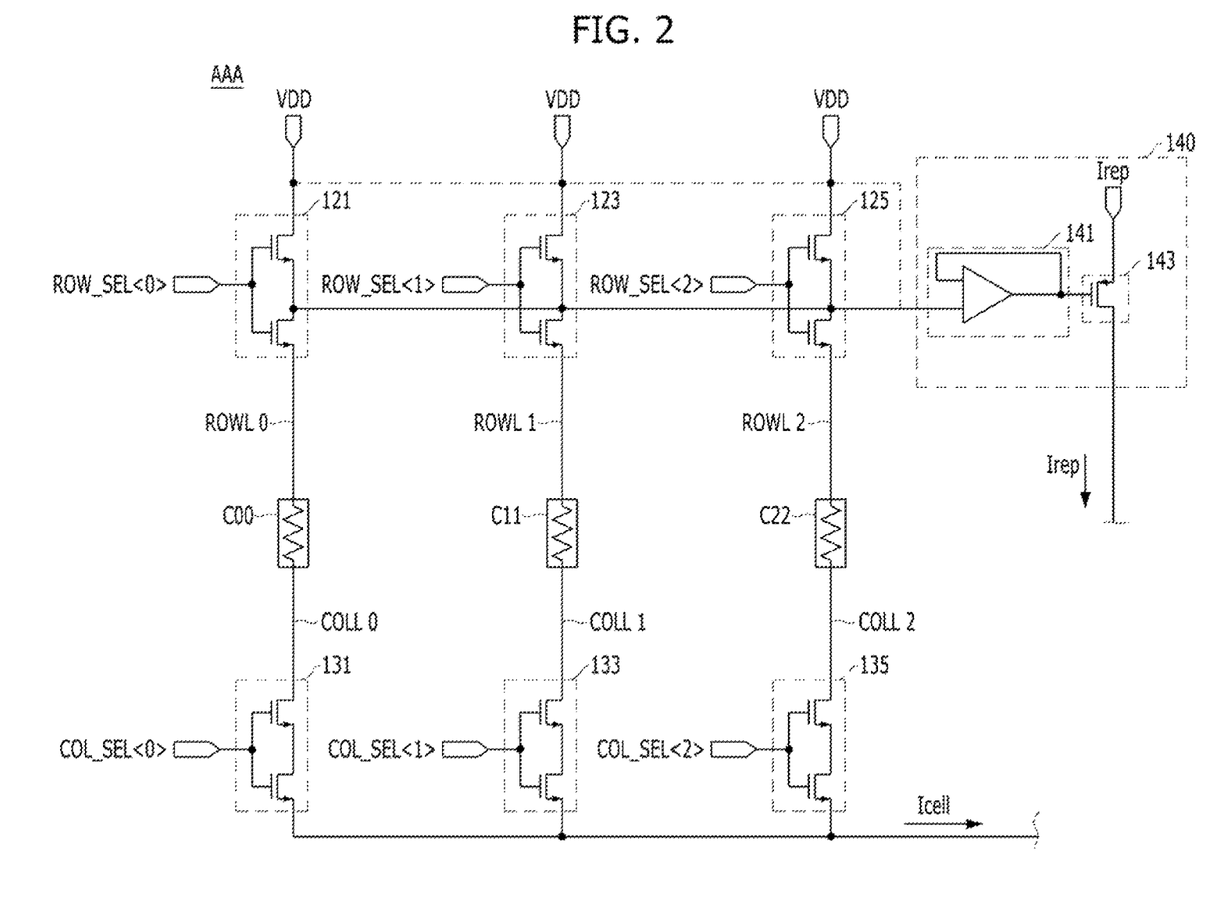
FIG. 2 is a circuit diagram illustrating a portion of the memory circuit shown in FIG. 1.

The memory cell array 110 may include a plurality of memory cells including memory cells C00, C11, and C22, which are illustrated in FIG. 2. The memory cells may be disposed where first to fifth row lines ROWL0 to ROWL4 cross first to fifth column lines COLL0 to COLL4, respectively. The memory cells may be coupled between the first to fifth row lines ROWL0 to ROWL4 and the first to fifth column lines COLL0 to COLL4. The memory cell array 110 may have, for example, a cross-point array structure.

The row selection block 120 may include first to fifth row selection units 121 to 129 respectively corresponding to the first to fifth row lines ROWL0 to ROWL4. The first to fifth row selection units 121 to 129 may select the first to fifth row lines ROWL0 to ROWL4 based on first to fifth row selection signals ROW_SEL<0:4>. For example, the first to fifth row selection signals ROW_SEL<0:4> may enable one of the first to fifth row selection units 121 to 129, and the enabled row selection unit may supply a high voltage, e.g., VDD, to a corresponding row line. The high voltage VDD may be supplied from a supply terminal.

The column selection block 130 may include first to fifth column selection units 131 to 139 respectively corresponding to the first to fifth column lines COLL0 to COLL4. The first to fifth column selection units 131 to 139 may select the first to fifth column lines COLL0 to COLL4 based on first to fifth column selection signals COL_SEL<0:4>. For example, the first to fifth column selection signals COL_SEL<0:4> may enable one of the first to fifth column selection units 131, 133, 135, 137, or 139, and the enabled column selection unit may supply a cell current Icell, which flows through a corresponding column line COLL0, COLL1, COLL2, COLL3, or COLL4, to the sensing block 150.

The alternate current supply block 140 may be coupled to each of the first to fifth row selection units 121 to 129 at a common node. In addition, the alternate current supply block 140 may selectively output, during a read operation, an alternate current Irep based on a resistance state of a selected memory cell among the memory cells. For example, the alternate current supply block 140 may supply the alternate current Irep to the sensing block 150 when the selected memory cell is in a low resistance state, and may block the alternate current Irep from being supplied to the sensing block 150 when the selected memory cell is in a high resistance state. The alternate current supply block 140 may indirectly identify the resistance state of the selected memory cell based on a voltage loaded onto a row selection unit coupled to the selected memory cell among the first to fifth row selection units 121 to 129.

The sensing block 150 may sense a read current based on at least one of the cell current Icell and the alternate current Irep during the read operation. For example, the read current sensed by the sensing block 150 may be a first read current including the cell current Icell and the alternate current Irep when the alternate current Irep is supplied by the alternate current supply block 140, and may be a second read current including only the cell current Icell when the alternate current Irep is not supplied by the alternate current supply block 140. In an implementation, the sensing block 150 may include a sensing amplifier that compares a reference current (not illustrated) with the read current.

FIG. 2 is a circuit diagram illustrating a portion AAA of the memory circuit 100 shown in FIG. 1. FIG. 2 illustrates the first to third memory cells C00, C11, and C22, the first to third row selection units 121, 123, and 125, the first to third column selection units 131, 133, and 135, and the alternate current supply block 140 of FIG. 1.

Referring to FIG. 2, the first memory cell C00 may be coupled between the first row line ROWL0 and the first column line COLL0. The second memory cell C11 may be coupled between the second row line ROWL1 and the second column line COLL1. The third memory cell C22 may be coupled between the third row line ROWL2 and the third column line COLL2. Each of the first to third memory cells C00, C11, and C22 may include, for example, an implementation of the variable resistance element described above.

The first to third row selection units 121, 123, and 125 may have the same structure. For example, each of the row selection units 121, 123, and 125 may include two switching elements coupled to each other in series between a node where a high voltage VDD is applied and one of the first to third row lines ROWL 0, ROWL 1, or ROWL2. The two switching elements of each of the row selection units 121, 123, and 125 may be controlled in response to one of the first to third row selection signals ROW_SEL<0>, ROW SEL<1>, or ROW SEL<2>.

In an implementation, the first row selection unit 121 may include first and second NMOS transistors coupled to each other in series. The first NMOS transistor may include a gate where the first row selection signal ROW_SEL<0> is inputted, as well as a drain and a source coupled between a first row coupling node and a first node where the high voltage VDD is applied. The second NMOS transistor may include a gate where the first row selection signal ROW_SEL<0> is inputted, as well as a drain and a source coupled between the first row coupling node and the first row line ROWL0.

The second row selection unit 123 may include third and fourth NMOS transistors coupled to each other in series. The third NMOS transistor may include a gate where the second row selection signal ROW_SEL<1> is inputted, as well as a drain and a source coupled between a second row coupling node and a second node where the high voltage VDD is applied. The fourth NMOS transistor may include a gate where the second row selection signal ROW_SEL<1> is inputted, as well as a drain and a source coupled between the second row coupling node and the second row line ROWL1.

The third row selection unit 125 may include fifth and sixth NMOS transistors coupled to each other in series. The fifth NMOS transistor may include a gate where the third row selection signal ROW_SEL<2> is inputted, as well as a drain and a source coupled between a third row coupling node and a third node where the high voltage VDD is applied. The sixth NMOS transistor may include a gate where the third row selection signal ROW_SEL<2> is inputted, as well as a drain and a source coupled between the third row coupling node and the third row line ROWL2.

The first to third column selection units 131, 133, and 135 may have the same structure. For example, each of the first to third column selection units 131, 133, and 135 may include two switching elements coupled in series between one of the first to third column lines COLL0, COLL1, or COLL2 and the sensing block 150. The two switching elements of each of the first to third column selection units 131, 133, and 135 may be controlled in response to one of the first to third column selection signals COL_SEL<0>, COL_SEL<1>, or COL_SEL<2>.

In an implementation, the first column selection unit 131 may include seventh and eighth NMOS transistors coupled to each other in series. The seventh NMOS transistor may include a gate where the first column selection signal COL_SEL<0> is inputted, as well as a drain and a source coupled between the first column line COLL0 and a first column coupling node. The eighth NMOS transistor may include a gate where the first column selection signal COL_SEL<0> is inputted, as well as a drain and a source coupled between the first column coupling node and the sensing block 150.

The second column selection unit 133 may include ninth and tenth NMOS transistors coupled to each other in series. The ninth NMOS transistor may include a gate where the second column selection signal COL_SEL<1> is inputted, as well as a drain and a source coupled between the second column line COLL1 and a second column coupling node. The tenth NMOS transistor may include a gate where the second column selection signal COL_SEL<1> is inputted, as well as a drain and a source coupled between the second column coupling node and the sensing block 150.

The third column selection unit 135 may include eleventh and twelfth NMOS transistors coupled to each other in series. The eleventh NMOS transistor may include a gate where the third column selection signal COL_SEL<2> is inputted, as well as a drain and a source coupled between the third column line COLL2 and a third column coupling node. The twelfth NMOS transistor may include a gate where the third column selection signal COL_SEL<2> is inputted, as well as a drain and a source coupled between the third column coupling node and the sensing block 150.

The alternate current supply block 140 may include a supply control unit 141 and a supply path unit 143. The supply control unit 141 may be coupled to each of the first to third row coupling nodes at a common node. The supply control unit 141 may selectively generate a supply control signal based on a voltage loaded onto one among the first to third row coupling nodes. Or, the supply control unit 141 may be coupled to each of the first to third nodes at a common node as described by a dotted line shown in FIG. 2. The supply control unit 141 may selectively generate the supply control signal based on a voltage loaded onto one among the first to third nodes. For example, the supply control unit 141 may, for example, include a voltage follower. The supply path unit 143 may selectively supply the alternate current Irep to the sensing block 150 in response to the supply control signal. The supply path unit 143 may, for example, include a switching element. The switching element may include a PMOS transistor. Although not illustrated in FIG. 2, the alternate current supply block 140 may further include an alternate current generation unit that generates the alternate current Irep and supplies the alternate current Irep to the supply path unit 143.

Hereinafter, a read operation of the memory circuit 100 described above is described in detail.

The following description explains an example of the read operation of the memory circuit 100 when the second memory cell C11 is selected and is in the low resistance state according to an implementation.

When the second row selection signal ROW_SEL<1> and the second column selection signal COL_SEL<1> are enabled, the second row selection unit 123 may couple the second node where the high voltage VDD is applied to the second row line ROWL1, and the second column selection unit 133 may couple the second column line COLL1 to the sensing block 150.

Since the second memory cell C11 is in the low resistance state, a relatively low voltage level is loaded onto the second row coupling node. Accordingly, the alternate current supply block 140 may supply the alternate current Irep to the sensing block 150. For example, the supply control unit 141 may generate the supply control signal, which may have a logic low level corresponding to the relatively low voltage level loaded onto the second row coupling node, and the supply control signal having the logic low level may turn on the supply path unit 143, which may thereby supply the alternate current Irep to the sensing block 150.

The second column selection unit 133 may supply the cell current Icell, which corresponds to the second memory cell C11 in the low resistance state, to the sensing block 150.

Subsequently, the sensing block 150 may sense the read current, which is a first read current that is a resultant current corresponding to the cell current Icell and the alternate current Irep. The sensing block 150 may, for example, compare the reference current with the first read current and output a sensing signal corresponding to the low resistance state based on the comparison result.

In summary, when the read operation is performed on the second memory cell C11 in the low resistance state, the alternate current supply block 140 may be enabled. When the alternate current supply block 140 is enabled, the alternate current Irep, which corresponds to the cell current Icell flowing through the second memory cell C11, may be supplied to the sensing block 150. The sensing block 150 may perform a sensing operation based on the read current, which is the first read current including the cell current Icell and the alternate current Irep. As a result, a read current margin may be improved during the sensing operation. In addition, because the read current margin is improved, the memory circuit 100 may be immune to a read disturbance and random telegraph noise (RTN) that may influence the second memory cell C11.

The following description explains an example of a read operation performed when the second memory cell C11 is selected and is in the high resistance state according to an implementation.

When the second row selection signal ROW_SEL<1> and the second column selection signal COL_SEL<1> are enabled, the second row selection unit 123 may couple the second node where the high voltage VDD is applied to the second row line ROWL1, and the second column selection unit 133 may couple the second column line COLL1 to the sensing block 150.

Since the second memory cell C11 is in the high resistance state, a voltage level that is relative high is loaded onto the second row coupling node. In response, the alternate current supply block 140 may block the alternate current Irep from the sensing block 150. For example, the supply control unit 141 may generate the supply control signal, which may have a logic high level corresponding to the relatively high voltage level loaded onto the second row coupling node, and the supply control signal having the logic high level may turn off the supply path unit 143, which may block the alternate current Irep from being supplied to the sensing block 150.

The second column selection unit 133 may supply the cell current Icell, which corresponds to the second memory cell C11 in the high resistance state, to the sensing block 150.

Subsequently, the sensing block 150 may sense the read current, which is a second read current including the cell current Icell only. The second read current may be independent from the alternating current Irep. The sensing block 150 may compare the reference current with the second read current and output the sensing signal corresponding to the high resistance state based on the comparison result.

In summary, when the read operation is performed on the second memory cell C11 in the high resistance state, the alternate current supply block 140 may be disabled. When the alternate current supply block 140 is disabled, it may not influence the second memory cell C11. Since the input impedance of the voltage follower is infinite, the input impedance may not influence the second memory cell C11.

In accordance with the implementations of the technology disclosed in this patent document, a sensing block that reads a memory cell in the low resistance state by sensing a higher read current than a cell current flowing through the memory cell may have an improved read current margin. In addition, a device that includes a single alternate current supply block for a plurality of row selection blocks occupies a minimal area, and may be easy to design.

In accordance with the implementations of the technology disclosed in this patent document, an electronic device may be immune to read disturbance and random telegraph noise (RTN), and may thus have an improved performance during a read operation.

The above and other memory circuits or semiconductor devices based on the disclosed technology may be used in a range of devices or systems. FIGS. 3-7 provide some examples of devices or systems that may implement the memory circuits disclosed herein.

Figure 3:
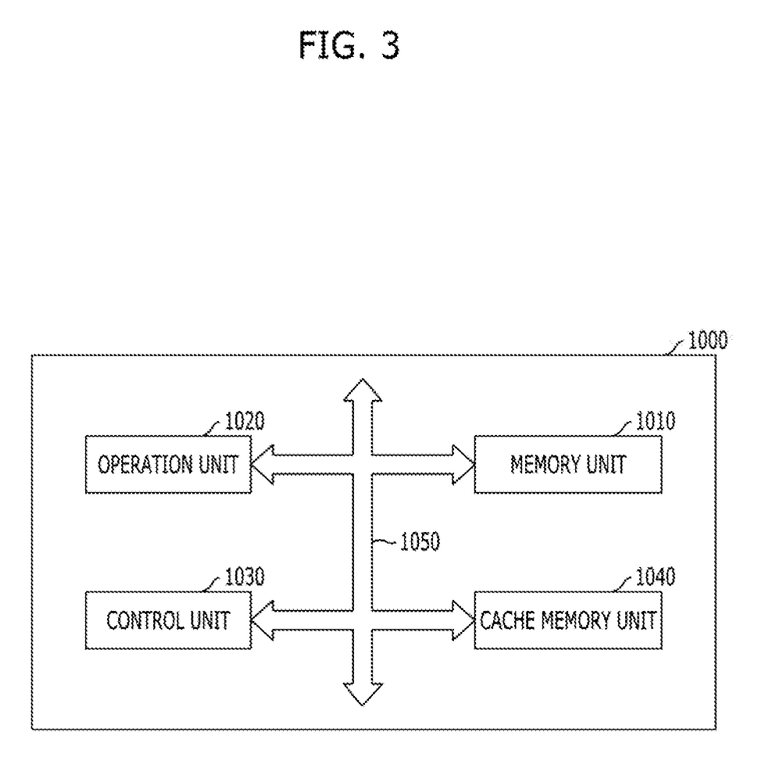
FIG. 3 is an example of configuration diagram of a microprocessor implementing memory circuitry based on the disclosed technology.

FIG. 3 is an example of configuration diagram of a microprocessor implementing memory circuitry based on the disclosed technology.

Referring to FIG. 3, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current. Through this, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
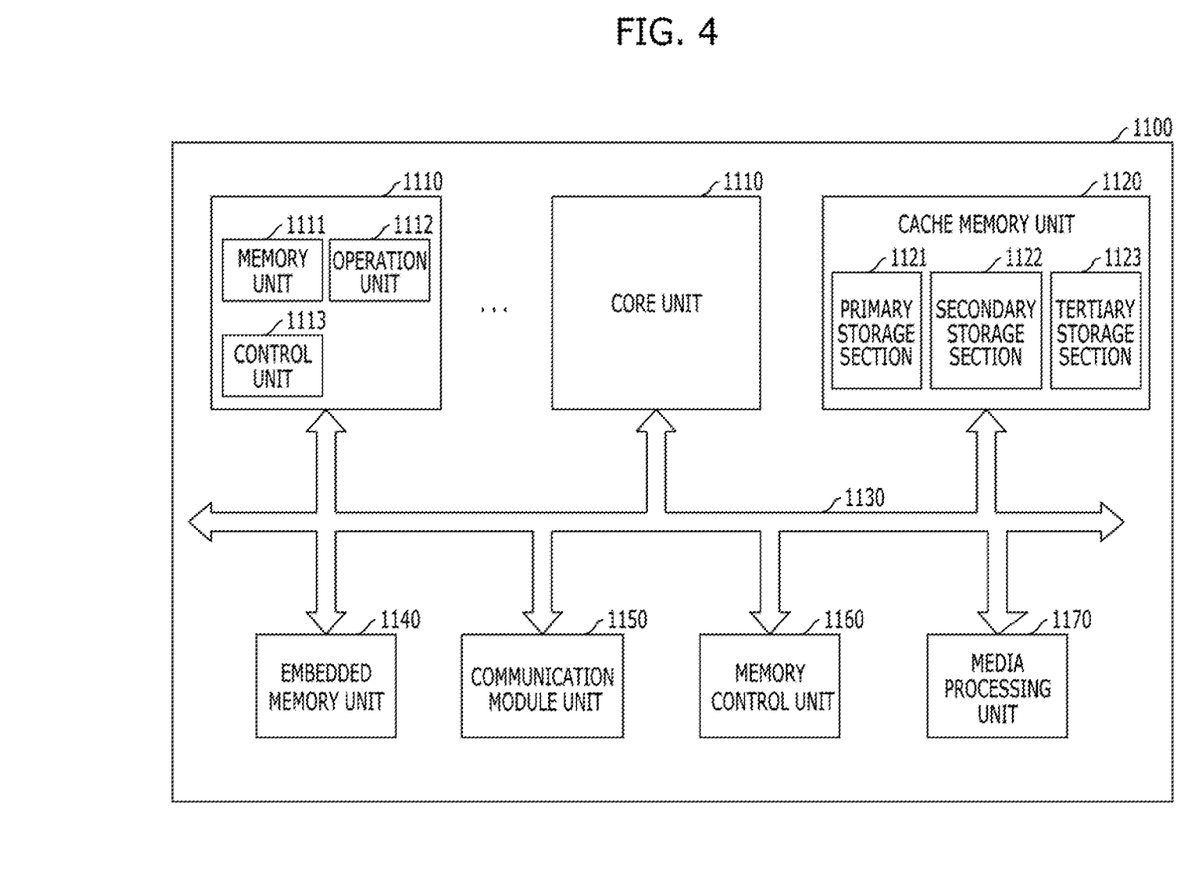
FIG. 4 is an example of configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current. Through this, characteristics of the cache memory unit 1120 may be improved. As a consequence, performance characteristics of the processor 1100 may be improved.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
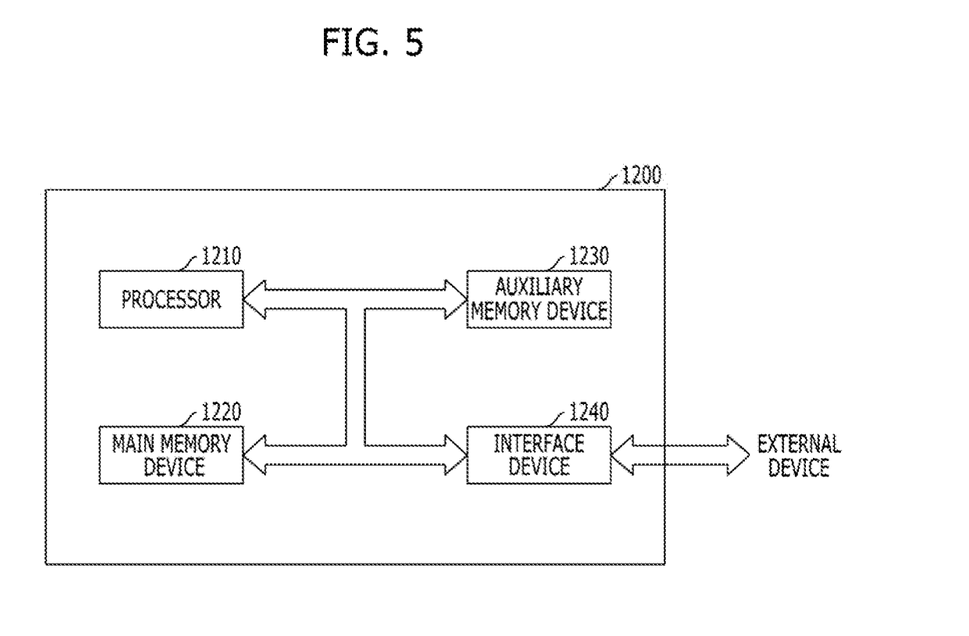
FIG. 5 is an example of configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
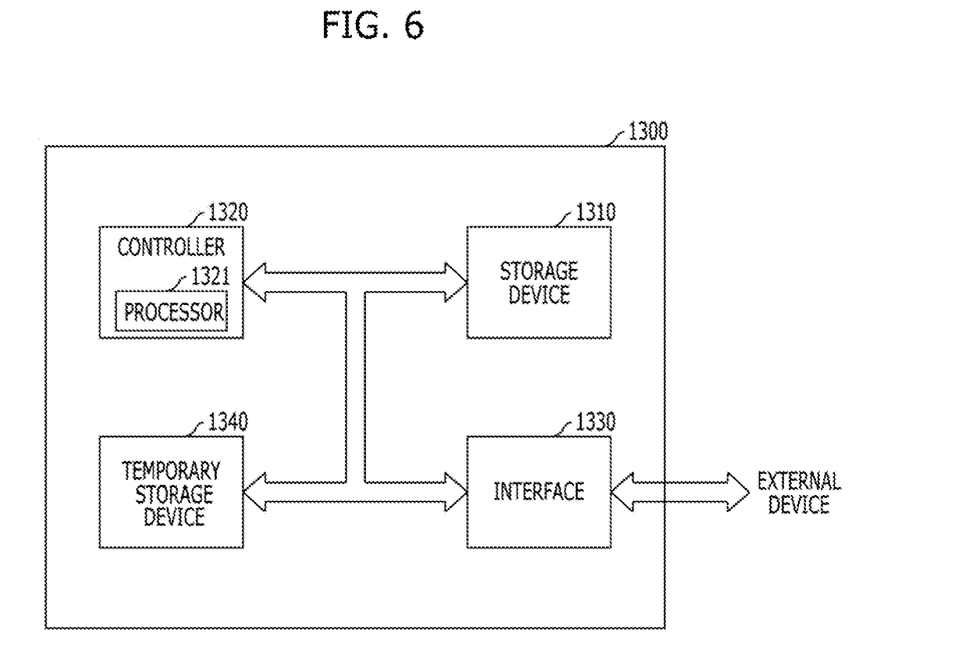
FIG. 6 is an example of configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current. Through this, characteristics of the temporary storage device 1340 may be improved. As a consequence, performance characteristics of the system 1300 may be improved.

Figure 7:
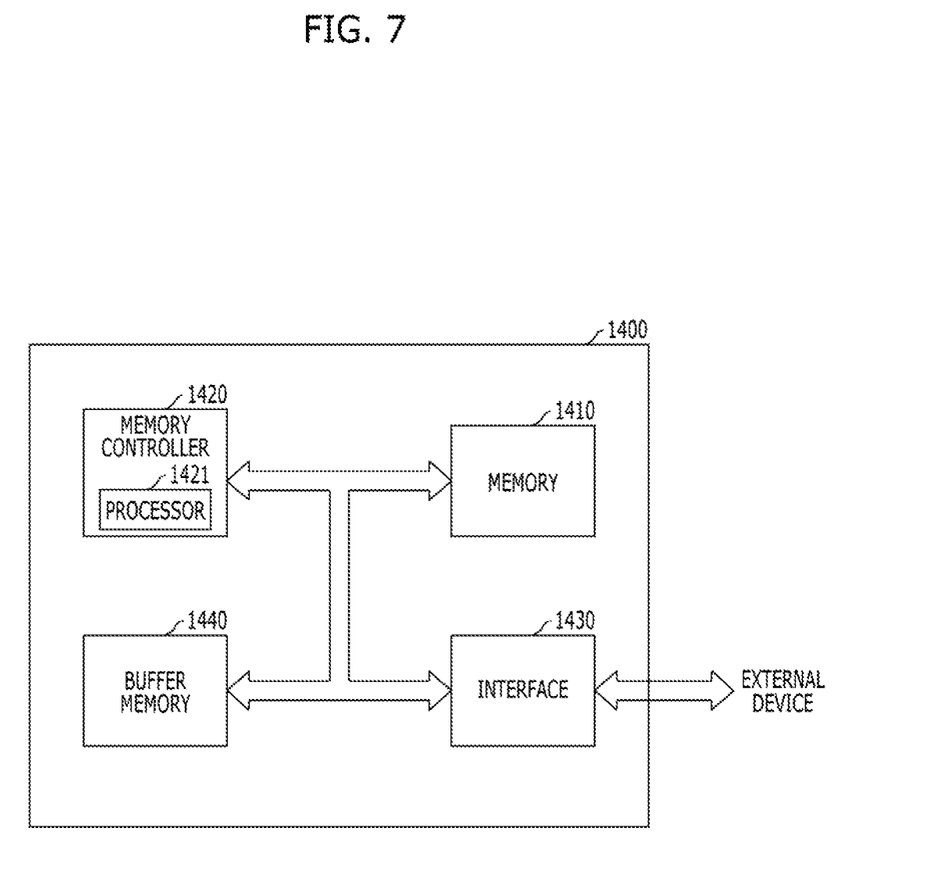
FIG. 7 is an example of configuration diagram of a memory system implementing memory circuitry based on the disclosed technology.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current. Through this, characteristics of the memory 1410 may be improved. As a consequence, performance characteristics of the microprocessor 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a memory cell coupled between a first line and a second line; a first selection block configured to select the first line; a second selection block configured to select the second line; an alternate current supply block configured to supply, during a read operation, an alternate current corresponding to a resistance state of the memory cell; and a sensing block configured to sense, during the read operation, at least one of a cell current flowing through the memory cell and the alternate current. Through this, characteristics of the buffer memory 1440 may be improved. As a consequence, performance characteristics of the microprocessor 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 3-7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a memory cell coupled between a first line and a second line;
    a first selection block configured to select the first line;
    a second selection block configured to select the second line;
    an alternate current supply block configured to selectively supply, based on a resistance state of the memory cell, an alternate current during a read operation; and
    a sensing block configured to sense, during the read operation, at least one of a cell current flowing through the memory cell and the alternate current.

2. The electronic device according to claim 1, wherein the alternate current corresponds to the cell current flowing through the memory cell, and
    wherein the alternate current supply block supplies the alternate current when the resistance state of the memory cell is a low resistance state.

3. The electronic device according to claim 1, wherein the alternate current supply block is configured to determine whether the alternate current is supplied or not based on a voltage loaded onto one of the first selection block and the second selection block.

4. The electronic device according to claim 3, wherein the alternate current supply block includes:
a supply control unit configured to generate a supply control signal based on the voltage; and
a supply path unit configured to supply the alternate current to the sensing block in response to the supply control signal.

5. The electronic device according to claim 4, wherein the supply control unit includes a voltage follower, and
wherein the supply path unit includes a switching element.

6. The electronic device of claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

7. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory that is part of the cache memory unit in the processor.

8. The electronic device of claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

9. The electronic device of claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

10. The electronic device of claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

11. An electronic device comprising a semiconductor memory, wherein the semiconductor memory comprises:
a plurality of row lines;
a plurality of column lines crossing the plurality of row lines;
a plurality of memory cells coupled between the row lines and the column lines;
a plurality of row selection blocks configured to select one among the plurality of row lines based on a plurality of row selection signals;
a plurality of column selection blocks configured to select one among the plurality of column lines based on a plurality of column selection signals;
an alternate current supply block coupled to the plurality of row selection blocks at a common node and configured to selectively supply, based on a resistance state of a selected one of the plurality of memory cells, an alternate current during a read operation; and
a sensing block configured to sense, during the read operation, at least one of a cell current and the alternate current, the cell current flowing through the selected one of the plurality of memory cells.

12. The electronic device according to claim 11, wherein the alternate current corresponds to the cell current flowing through the selected memory cell, and
wherein the alternate current supply block supplies the alternate current to the sensing block when the selected memory cell is in a low resistance state.

13. The electronic device according to claim 11, wherein each of the plurality of row selection blocks includes one or more switching elements, each configured to supply a high voltage to a corresponding row line among the plurality of row lines based on a corresponding row selection signal among the plurality of row selection signals.

14. The electronic device according to claim 12, wherein each of the plurality of row selection blocks includes first and second switching elements coupled to each other in series, and
wherein the alternate current supply block is coupled to a coupling node between the first and second switching elements.

15. The electronic device according to claim 14, wherein the alternate current supply block includes:

a supply control unit configured to generate a supply control signal based on a voltage loaded onto the coupling node; and a supply path unit configured to supply the alternate current to the sensing block in response to the supply control signal.

16. The electronic device according to claim 15, wherein the supply control unit includes a voltage follower, and wherein the supply path unit includes a switching element.

17. The electronic device according to claim 12, wherein each of the plurality of row selection blocks includes one or more switching elements, and wherein the alternate current supply block is coupled to a coupling node between a supply terminal supplying a high voltage and one of the switching elements.

18. The electronic device according to claim 17, wherein the alternate current supply block includes:

a supply control unit configured to generate a supply control signal based on a voltage loaded onto the coupling node; and a supply path unit configured to supply the alternate current to the sensing block in response to the supply control signal.

19. The electronic device according to claim 18, wherein the supply control unit includes a voltage follower, and wherein the supply path unit includes a switching element.

20. A method for driving an electronic device including a semiconductor memory, the method comprising:

selecting a memory cell coupled between a single row line among a plurality of row lines and a single column line among a plurality of column lines;

supplying during a read operation, by an alternate current supply block, an alternate current corresponding to a resistance state of the selected memory cell; and sensing, by a sensing block, at least one of a first read current and a second read current based on a cell current and the alternate current, the cell current flowing through the selected memory cell and including a first cell current or a second cell current, the first read current being a resultant current based on the first cell current flowing through the memory cell when the memory cell is in a low resistance state and the alternate current generated based on the first cell current, the second read current being the second cell current flowing through the memory cell when the memory cell is in a high resistance state, wherein selecting the memory cell includes selecting the single row line by a first selection block and selecting the single column line by a second selection block.

* * * * *